(12) United States Patent
Oh et al.

(10) Patent No.: US 7,489,586 B2
(45) Date of Patent: Feb. 10, 2009

(54) SEMICONDUCTOR MEMORY DEVICE AND DRIVING METHOD THEREOF

(75) Inventors: Young-Hoon Oh, Kyoungki-do (KR); Kwang-Myoung Rho, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 62 days.

(21) Appl. No.: 11/647,402

(22) Filed: Dec. 29, 2006

(65) Prior Publication Data

US 2008/0002514 A1 Jan. 3, 2008

(30) Foreign Application Priority Data

Jun. 29, 2006 (KR) .................. 10-2006-0059735

(51) Int. Cl.
*G11C 8/00* (2006.01)
(52) U.S. Cl. .................. 365/233; 365/194; 365/189.05
(58) Field of Classification Search .................. 365/194, 365/189.05; 327/156, 158
See application file for complete search history.

(56) References Cited

U.S. PATENT DOCUMENTS

| 6,859,404 | B1 * | 2/2005 | Kim ........................... 365/194 |
| 6,996,026 | B2 * | 2/2006 | Brox et al. .................. 365/233 |
| 7,171,321 | B2 * | 1/2007 | Best ........................... 365/194 |

FOREIGN PATENT DOCUMENTS

| KR | 10-2005-0020359 A | 3/2005 |
| KR | 10-2005-0048755 A | 5/2005 |
| KR | 10-2005-0109813 A | 11/2005 |

OTHER PUBLICATIONS

Korean Notice of Allowance issued in Korean Patent Application No. KR 10-2006-0059735, dated Apr. 29, 2008.

* cited by examiner

*Primary Examiner*—David Lam
(74) *Attorney, Agent, or Firm*—McDermott Will & Emery LLP

(57) ABSTRACT

A semiconductor memory device includes: a variable delay for delaying a delay locked loop (DLL) clock by a predetermined delay time to output a delayed DLL clock; an output driver for outputting data and data strobe signal in response to the delayed DLL clock; and a calibration controller for controlling the predetermined delay time of the variable delay in response to output AC parameters.

11 Claims, 4 Drawing Sheets

SEMICONDUCTOR MEMORY DEVICE AND DRIVING METHOD THEREOF

FIELD OF THE INVENTION

The present invention relates to a semiconductor memory device, and more particularly, to a synchronous semiconductor device and a method for controlling output AC parameters thereof.

DESCRIPTION OF RELATED ART

A synchronous semiconductor memory device shares a system clock output from a clock generator with a chipset and receives or transfers command, address and data in synchronization with the system clock.

FIG. 1 is a block diagram of a communication scheme between a synchronous dynamic random access memory (DRAM) and a chipset.

In a write operation, the chipset transfers command CMD, address ADD, and data DQ to the DRAM. The chipset also transfers a data strobe signal DQS to the DRAM together with the data DQ.

In a read operation, the DRAM receives the command CMD and the address ADD from the chipset and transfers the corresponding data DQ to the chipset together with the data strobe signal DQS.

The chipset transfers the data strobe signal DQS to the DRAM in the write operation, while the DRAM transfers the data strobe signal DQS to the chipset in the read operation.

The data strobe signal DQS is used for source synchronization and is also called "echo clock". If the data DQS is strobed in synchronization with the data strobe signal DQS, skew between the clock CLK and the data DQS can be reduced.

FIG. 2 is a diagram relating AC parameters in a read operation of a DDR SDRAM.

Timing of data DQ and data strobe signal DQS is illustrated in FIG. 2. In FIG. 2, "tDQSQ" is a parameter representing skew between the data strobe signal DQS and the data DQ, "tDQSCK" is a parameter representing skew between the data strobe signal DQS and clock CLK, and "tAC" is a parameter representing skew between the data DQ and the clock CLK.

In order to enable a chipset to receive the data DQ, a DRAM sets the data strobe signal DQS to a low-Z state during tRPRE (read DQS preamble time). When data (DQ) transmission is completed, the DRAM sets the data strobe signal DQS to a high-Z state after tRPST (read DQS postamble time). In this manner, the read operation is completed.

If any one of the above-described parameters does not meet the specification, operation error will occur because the chipset receives incorrect data. However, the conventional DRAM module and chipset do not actively control the output AC parameters, e.g., tDQSQ, tDQSCK, etc. Thus, the system will shut down when the output AC parameters are distorted by fluctuation of a board power supply or ambient temperature characteristic. Moreover, as the operation speed of the DRAM increases, the specification requirements of the output AC parameters become narrower. Consequently, the development of high-speed DRAMs becomes increasingly more difficult

SUMMARY OF THE INVENTION

It is, therefore, an object of the present invention to provide a semiconductor memory device that can actively control the output AC parameters, and a driving method thereof.

In accordance with an aspect of the present invention, a semiconductor memory device includes: a variable delay for delaying a delay locked loop (DLL) clock by a predetermined delay time to output a delayed DLL clock; an output driver for outputting data and data strobe signal in response to the delayed DLL clock; and a calibration controller for controlling the predetermined delay time of the variable delay in response to output AC parameters.

In accordance with another aspect of the present invention, a method for driving a semiconductor memory device includes: measuring output AC parameters; setting a delay value with respect to a delay locked loop (DLL) clock in response to the measured values of the output AC parameters; delaying the DLL clock by the delay value to output a delayed DLL clock; and outputting data strobe signal and data having calibrated output AC parameters in response to the delayed DLL clock.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A semiconductor memory device and a driving method thereof in accordance with exemplary embodiments of the present invention will be described in detail with reference to the accompanying drawings.

Figure 1:
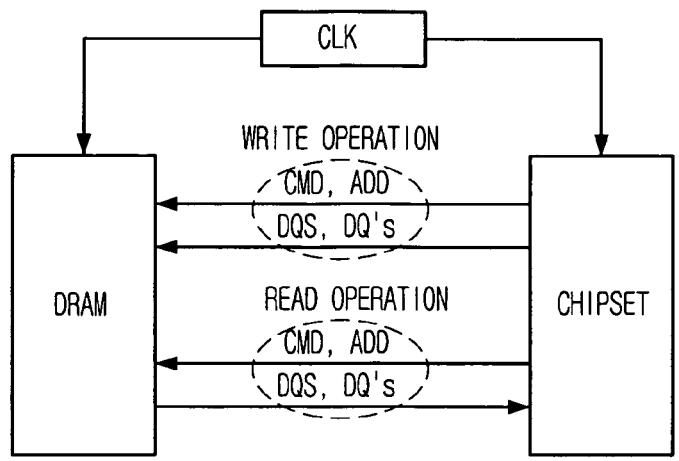
FIG. 1 is a block diagram of a communication scheme between a Synchronous DRAM and a chipset.
Figure 2:
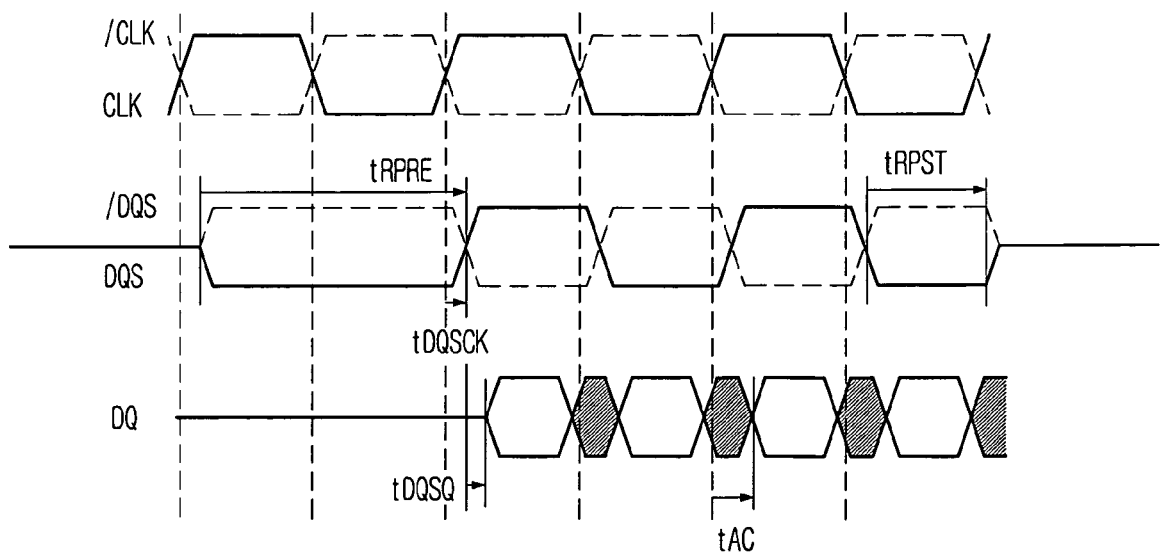
FIG. 2 is a diagram relating AC parameters in a read operation of a DDR SDRAM.
Figure 3:
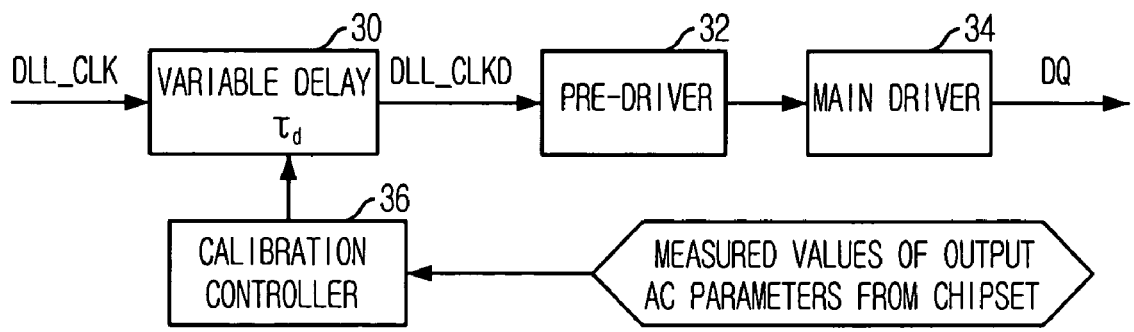
FIG. 3 is a block diagram of a DRAM in accordance with a first embodiment of the present invention.

FIG. 3 is a block diagram of a DRAM in accordance with a first embodiment of the present invention.

The DRAM in accordance with the first embodiment of the present invention includes a variable delay 30, a pre-driver 32, a main driver 34, and a calibration controller 36. The variable delay 30 delays a delay locked loop (DLL) clock DLL_CLK to output a delayed DLL clock DLL_CLKD, and the pre-driver 32 pre-drives an output data signal in response to the delayed DLL clock DLL_CLKD. The main driver 34 drives a data output terminal DQ in response to an output signal of the pre-driver 32. The calibration controller 36 controls a delay time ($\tau_d$) of the variable delay 30 in response to measured values of output AC parameters. The measured values of the output AC parameters are received from a chipset.

Figure 4:
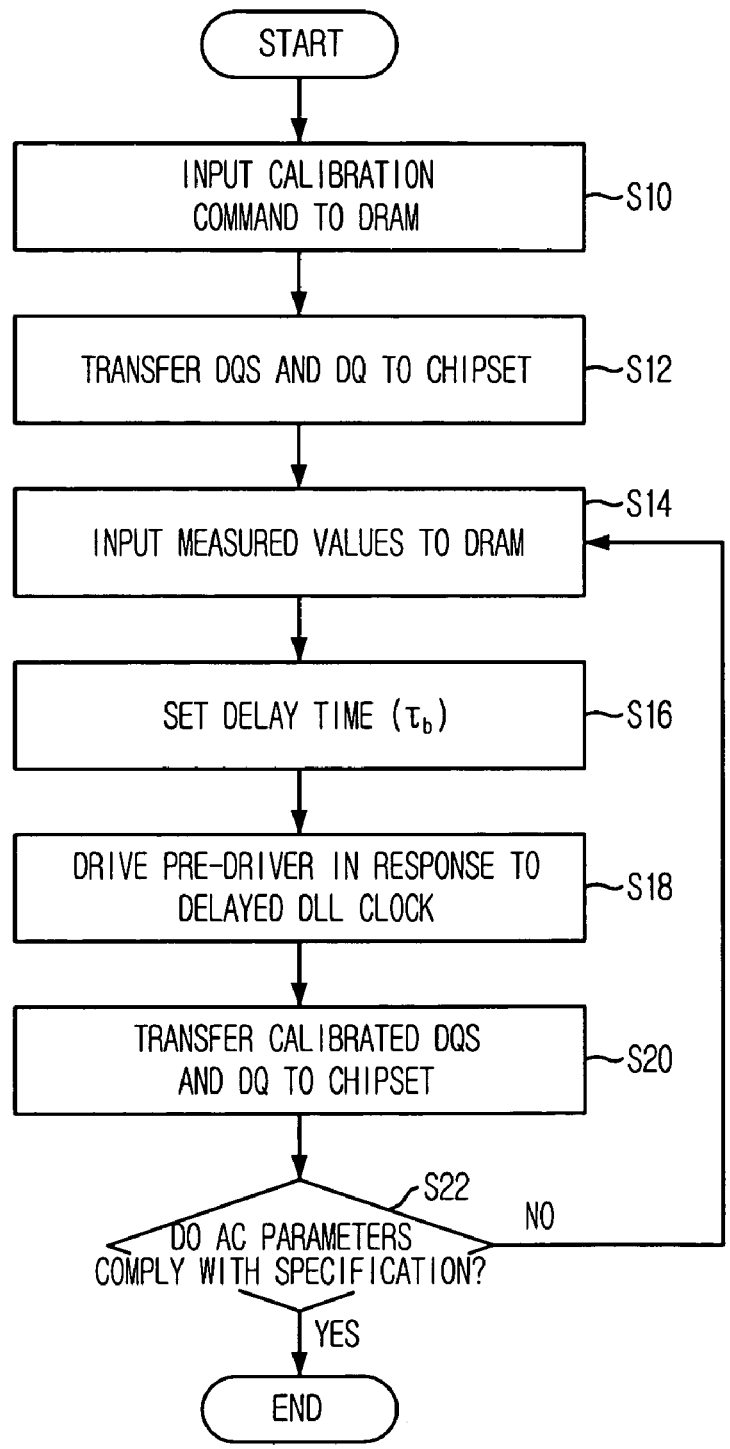
FIG. 4 is a flow chart of a calibration operation of the DRAM of FIG. 3.

FIG. 4 is a flow chart of a calibration operation of the DRAM of FIG. 3.

When the chipset inputs a calibration command to the DRAM in step S10, the DRAM transfers data strobe signal DQS and data DQ to the chipset in step S12.

In step S14, the chipset measures the output AC parameters (e.g., tDQSCK, tDQSQ, etc.) in the data strobe signal DQS and the data DQ, and transfers the measured values of the output AC parameters to the DRAM. In step S16, the calibration controller 36 sets the delay time ($\tau_d$) of the variable delay 30 in response to the measured values.

In this case, the variable delay 30 delays the DLL clock DLL_CLK by $+\tau_d$ or $-\tau_d$, and the pre-driver 32 is driven in response to the delayed DLL clock DLL_CLKD in step S18. In step S20, the calibrated data strobe signal DQS and the calibrated data DQ are transferred to the chipset.

In step S22, the chipset remeasures the output AC parameters, based on the calibrated data strobe signal DQS and the calibrated data DQ, and determines if the AC parameters comply with the specification. When the AC parameters comply with the specification, the calibration operation is completed. When the AC parameters do not comply with the specification, the process returns to step S14 to transfer the remeasured values to the DRAM. This loop is repeated until the AC parameters comply with the specification. Since steps subsequent to step S22 are a verify operation, they can be omitted.

Figure 5:
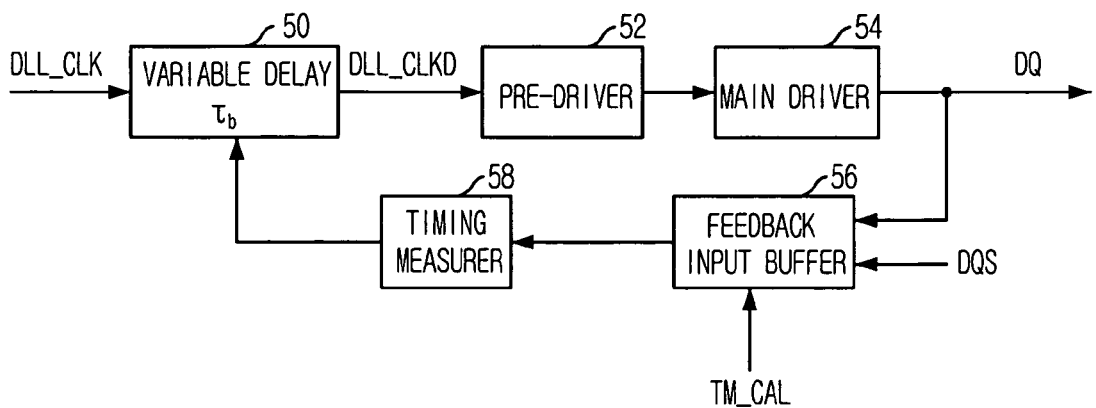
FIG. 5 is a block diagram of a DRAM in accordance with a second embodiment of the present invention.

FIG. 5 is a block diagram of a DRAM in accordance with a second embodiment of the present invention.

The DRAM in accordance with the second embodiment of the present invention includes a variable delay 50, a pre-driver 52, a main driver 54, a feedback input buffer 56, and a timing measurer 58. The variable delay 50 delays a DLL clock DLL_CLK to output a delayed DLL clock DLL_CLKD, and the pre-driver 52 pre-drives an output data signal in response to the delayed DLL clock DLL_CLKD. The main driver 54 drives a data output terminal DQ in response to an output signal of the pre-driver 52. The feedback input buffer 56 feeds back data DQ and data strobe signal DQS to the timing measurer 58 in response to a calibration test mode signal TM_CAL. The timing measurer 58 measures output AC parameters (e.g., tDQSCK, tDQSQ, etc.) of the data DQ and the data strobe signal DQS, and controls the delay time ($\tau_d$) of the variable delay 30 in response to the measurement values of the output AC parameters.

When a calibration command is input from the chipset, the DRAM activates the calibration test mode signal TM_CAL in response to the calibration command. When the calibration test mode signal TM_CAL is activated, the feedback input buffer 56 is enabled to receive the data DQ and the data strobe signal DQS. The timing measurer 58 measures skew between the data DQ and the data strobe signal DQS and controls the delay time ($\tau_d$) of the DLL clock DLL_CLK according to the measured skew. When the calibration test mode signal TM_CAL is deactivated after the calibration operation is completed, the DRAM transfers a calibration test mode exit signal to the chipset.

Figure 6:
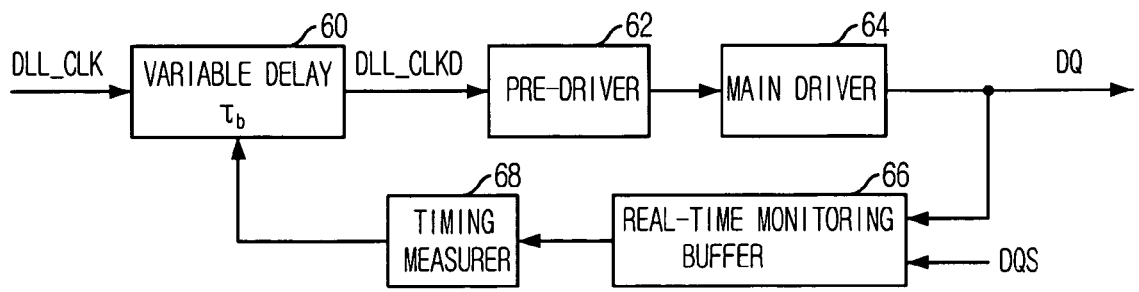
FIG. 6 is a block diagram of a DRAM in accordance with a third embodiment of the present invention.

FIG. 6 is a block diagram of a DRAM in accordance with a third embodiment of the present invention.

The DRAM in accordance with the third embodiment of the present invention includes a variable delay 60, a pre-driver 62, a main driver 64, a real-time monitoring buffer 66, and a timing measurer 68. The variable delay 60 delays a DLL clock DLL_CLK to output a delayed DLL clock DLL_CLKD, and the pre-driver 62 pre-drives an output data signal in response to the delayed DLL clock DLL_CLKD. The main driver 64 drives a data output terminal DQ in response to an output signal of the pre-driver 62. The real-time monitoring buffer 66 monitors data DQ and data strobe signal DQS, which is being transferred to the chipset. The timing measurer 68 measures output AC parameters (e.g., tDQSCK, tDQSQ, etc.) in data DQ and data strobe signal DQS received from the real-time monitoring buffer 66, and controls the delay time ($\tau_d$) of the variable delay 60 in response to the measured values.

In this embodiment, the DRAM itself performs the calibration without calibration command provided from the chip set. Although the real-time monitoring buffer 66 must be embedded into the DRAM, it is possible to omit time taken to perform the calibration through the communication between the DRAM and the chipset.

If undesired skew occurs during the operation of the DRAM, the skew can be immediately adjusted to meet the specification without time loss because the DRAM monitors the skew in real time.

As described above, the embodiments of the present invention provide the timing control methods that can actively adjust the output AC parameters in the memory device. In the first method, the chipset transfers the calibration command and the measured values of the output AC parameters to the memory device, and the memory device performs the calibration operation. In the second method, when the chipset transfers the calibration command to the memory device, the memory device measures the output AC parameters and performs the calibration operation. In the third method, the memory device transfers the data strobe signal DQS and the data DQ to the chipset while monitoring them in real time, without calibration command of the chipset.

Therefore, the memory device can actively control the output AC parameters, thus providing the decreased failure rate and the improved reliability. In addition, the memory device can cope with the narrowed specification requirements of the AC parameters, attributing to the developments of high-speed memory devices.

Although the DRAM has been described, the present invention is not limited to the DRAM. That is, the present invention can also be applied to any memory device that communicates the chipset using data strobe signal.

The present application contains subject matter related to Korean patent application No. 2006-59735, filed in the Korean Intellectual Property Office on Jun. 29, 2006, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A semiconductor memory device, comprising:
  a variable delay for delaying a delay locked loop (DLL) clock by a predetermined delay time to output a delayed DLL clock;
  an output driver for outputting data and data strobe signal in response to the delayed DLL clock; and
  a calibration controller for controlling the predetermined delay time of the variable delay according to output AC parameters,
  wherein the calibration controller comprises:
  a feedback input buffer for feeding back the data and the data strobe signal, which are being transferred to a chipset, in response to a calibration test mode signal generated when a calibration command is received; and
  a timing measurer for receiving the data and the data strobe signal from the feedback input buffer and control the predetermined delay time by measuring the output AC parameters.

2. The semiconductor memory device of claim 1, wherein the calibration controller controls the predetermined delay time according to measured values of the output AC parameters, the measured values being received from the chipset.

3. The semiconductor memory device of claim 1, wherein the calibration controller comprises:

a real-time monitor for monitoring the data and the data strobe signal being transferred to the chipset; and a timing measurer for receiving the data and the data strobe signal from the real-time monitor and controlling the predetermined delay time by measuring the output AC parameters.

4. The semiconductor memory device of claim 1, wherein the output driver comprises:

a pre-driver for pre-driving an output data signal; and a main driver for driving a data output terminal in response to an output signal of the pre-driver.

5. The semiconductor memory device of claim 1, wherein the output AC parameters include at least one of a parameter representing skew between the data strobe signal and the data, a parameter representing skew between the data strobe signal and a clock, and a parameter representing skew between the data and the clock.

6. A method for driving a semiconductor memory device, comprising:

measuring output AC parameters;

setting a delay value with respect to a delay locked loop (DLL) clock in response to the measured values of the output AC parameters;

delaying the DLL clock by the delay value to output a delayed DLL clock; and outputting data strobe signal and data having calibrated output AC parameters in response to the delayed DLL clock, wherein the measuring of the output AC parameters comprises:

generating a calibration test mode signal in response to a calibration command:

feeding back the data and the data strobe signal of being transmitted to a chipset in response to the calibration test mode signal; and measuring the output AC parameters by using the fed-back data strobe signal and the fed-back data.

7. The method of claim 6, wherein the measuring of the output AC parameters includes:

transmitting the data and the data strobe signal to the chipset in response to the calibration command; and receiving the output AC parameters measured at the chipset by using the data strobe signal and the data.

8. The method of claim 6, wherein the measuring of the output AC parameters comprises:

monitoring in real time the data and the data strobe signal of being transmitted to the chipset; and measuring the output AC parameters by using the data and the data strobe signal.

9. The method of claim 6, further comprising completing a calibration operation when the output AC parameters remeasured at the chipset based on the data and the data strobe signal having the calibrated output AC parameters comply with a specification.

10. The method of claim 6, further comprising returning to the receiving of the output AC parameters when the output AC parameters remeasured at the chipset based on the data and the data strobe signal having the calibrated output AC parameters do not comply with a specification.

11. The method of claim 6, wherein the output AC parameters include at least one of a parameter representing skew between the data strobe signal and the data, a parameter representing skew between the data strobe signal and a clock, and a parameter representing skew between the data and the clock.

* * * * *